(12) United States Patent
Miyazaki et al.

(10) Patent No.: US 7,431,072 B2
(45) Date of Patent: *Oct. 7, 2008

(54) HEAT SINK WITH INCREASED COOLING CAPACITY AND SEMICONDUCTOR DEVICE COMPRISING THE HEAT SINK

(75) Inventors: Ryuuji Miyazaki, Kawasaki (JP); Masumi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/648,632

(22) Filed: Jan. 3, 2007

(65) Prior Publication Data

US 2007/0107872 A1 May 17, 2007

Related U.S. Application Data

(60) Division of application No. 10/500,464, filed on Jul. 14, 2004, now Pat. No. 7,219,721, which is a continuation of application No. PCT/JP02/00243, filed on Jan. 16, 2002.

(51) Int. Cl.
*H05K 7/20* (2006.01)

(52) U.S. Cl. ............... 165/80.3; 165/185; 361/705

(58) Field of Classification Search ............ None
See application file for complete search history.

(56) References Cited

U.S. PATENT DOCUMENTS

| | | | |
|---|---|---|---|
| 5,367,193 A | 11/1994 | Malladi | 257/707 |
| 5,594,623 A | 1/1997 | Schwegler | 361/697 |
| 5,658,831 A | 8/1997 | Layton et al. | |
| 5,969,949 A | 10/1999 | Kim et al. | 361/704 |
| 5,981,085 A | 11/1999 | Ninomiya et al. | 428/614 |
| 6,114,048 A | 9/2000 | Jech et al. | 428/547 |
| 6,245,442 B1 | 6/2001 | Towata et al. | 428/614 |
| 6,442,026 B2 | 8/2002 | Yamaoka | 361/704 |
| 6,702,007 B1 | 3/2004 | Pan et al. | 165/185 |
| 6,847,113 B2 | 1/2005 | Nakanishi et al. | 257/712 |
| 6,849,941 B1 | 2/2005 | Hill et al. | 257/710 |
| 6,898,084 B2 | 5/2005 | Misra | 361/710 |
| 6,977,814 B2 | 12/2005 | Hornung | 361/690 |
| 2002/0179287 A1 | 12/2002 | Graf et al. | 165/80.3 |
| 2003/0051867 A1* | 3/2003 | Kennedy | 165/185 |
| 2003/0116312 A1 | 6/2003 | Krassowski et al. | 165/185 |
| 2004/0223303 A1 | 11/2004 | Hornung | 361/704 |

FOREIGN PATENT DOCUMENTS

| | | |
|---|---|---|
| JP | 7-273256 | 10/1995 |
| JP | 9-8188 | 1/1997 |
| JP | 09-293808 | 11/1997 |
| JP | 10092985 A * | 4/1998 |
| JP | 11-317479 | 11/1999 |
| JP | 2001-168562 | 6/2001 |

* cited by examiner

*Primary Examiner*—Allen J Flanigan
(74) *Attorney, Agent, or Firm*—Kratz, Quintos & Hanson, LLP (57) ABSTRACT

A heat sink for a semiconductor device comprises a base which has a first surface on which a plurality of heat-radiating fins are arranged, and a second surface which contacts the semiconductor device directly. A heat spreader is provided on the second surface of the base so that the heat spreader does not contact the semiconductor device directly.

1 Claim, 10 Drawing Sheets

HEAT SINK WITH INCREASED COOLING CAPACITY AND SEMICONDUCTOR DEVICE COMPRISING THE HEAT SINK

CROSS-REFERENCE TO RELATED APPLICATIONS

This application is a divisional application of U.S. Ser. No. 10/500,464, filed Jul. 14, 2004 now U.S. Pat. No. 7,219,721, which was a U.S. continuation application filed under 35 USC 111(a) and claims the benefit of priority under 35 USC 120 and 365(c) from the prior International Application No. PCT/JP02/00243, filed on Jan. 16, 2002.

BACKGROUND OF THE INVENTION

1. Field of the Invention

The present invention relates to a heat sink with increased cooling capacity, and a semiconductor device comprising the heat sink with increased cooling capacity.

2. Description of the Related Art

In recent years, in addition to the miniaturization and slim structure of semiconductor devices such as LSI, there is a growing demand for increasing the cooling capacity of the heat sink provided in the semiconductor device, in order to meet the increase in the heating quantity of LSI.

In order to effectively dissipate the heat from the heat-producing semiconductor component such as an LSI chip, the heat sink usually includes a base in which a plurality of heat-radiating fins are arranged in parallel formation, and a heat spreader bonded to the surface of the semiconductor component. For example, Japanese Laid-Open Patent Application No. 07-273256 discloses such heat sink. The heat spreader is formed of a thermally conductive metallic material, such as copper. The heat-radiating fins of the base are provided to receive the heat generated by the LSI at the time of operation through the heat spreader and the base, so that the heat received from the LSI is dissipated in the heat-radiating fins. The heat sink provides the increased cooling capacity in this manner, and makes it possible to prevent the temperature of the semiconductor device from exceeding its heat-resistant temperature due to the heat generated at the time of operation.

On the other hand, with the trend of higher integration and higher speed of the semiconductor devices, many LSI chips have the increasing amount of heat generated during operation. In order to increase the cooling capacity of the heat sink more for such semiconductor devices, it is necessary to enlarge the size of the heat sink.

However, the size of the heat sink must meet the restriction requirements in order to develop the composition of the semiconductor device. Hence, it is difficult for the conventional heat sink to meet sufficient cooling capacity by improving only the configuration of the heat sink. For this reason, it is desired to configure the heat sink that allows the miniaturization and slim structure of the semiconductor device wherein the size of the heat sink can be maintained at a level equivalent to the current size without reducing the cooling capacity of the heat sink for a highly heat-producing semiconductor device.

A description will now be given of an example of the embedded-type conventional heat sink using FIG. 1 and FIG. 2.

Figure 1:
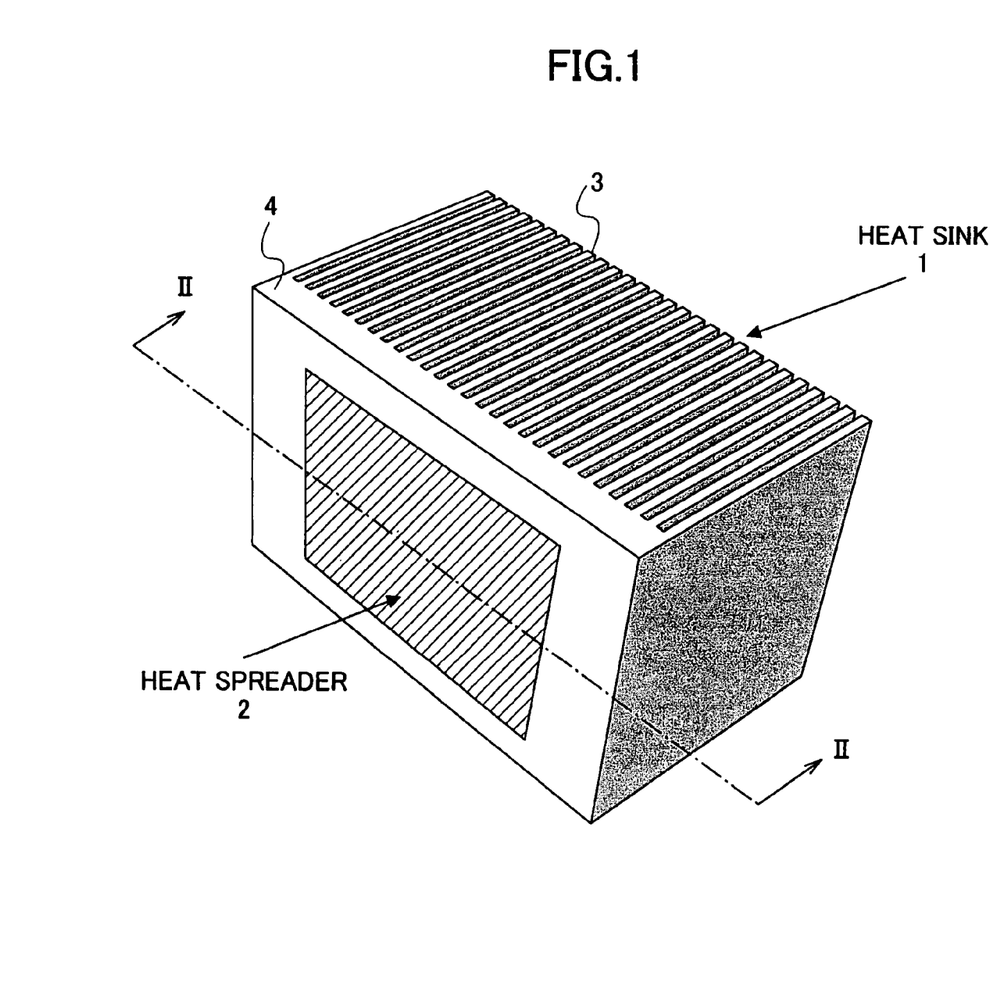
FIG. 1 is a diagram showing the composition of a conventional heat sink.

FIG. 1 shows the composition of the conventional heat sink. FIG. 2 shows the composition of the semiconductor device comprising the conventional heat sink shown in FIG. 1. In FIG. 2, (A) indicates the cross-section of the semiconductor device taken along the one-dot chain line II-II shown in FIG. 1, and (B) indicates the back surface of the semiconductor device shown in FIG. 1.

Figure 2:
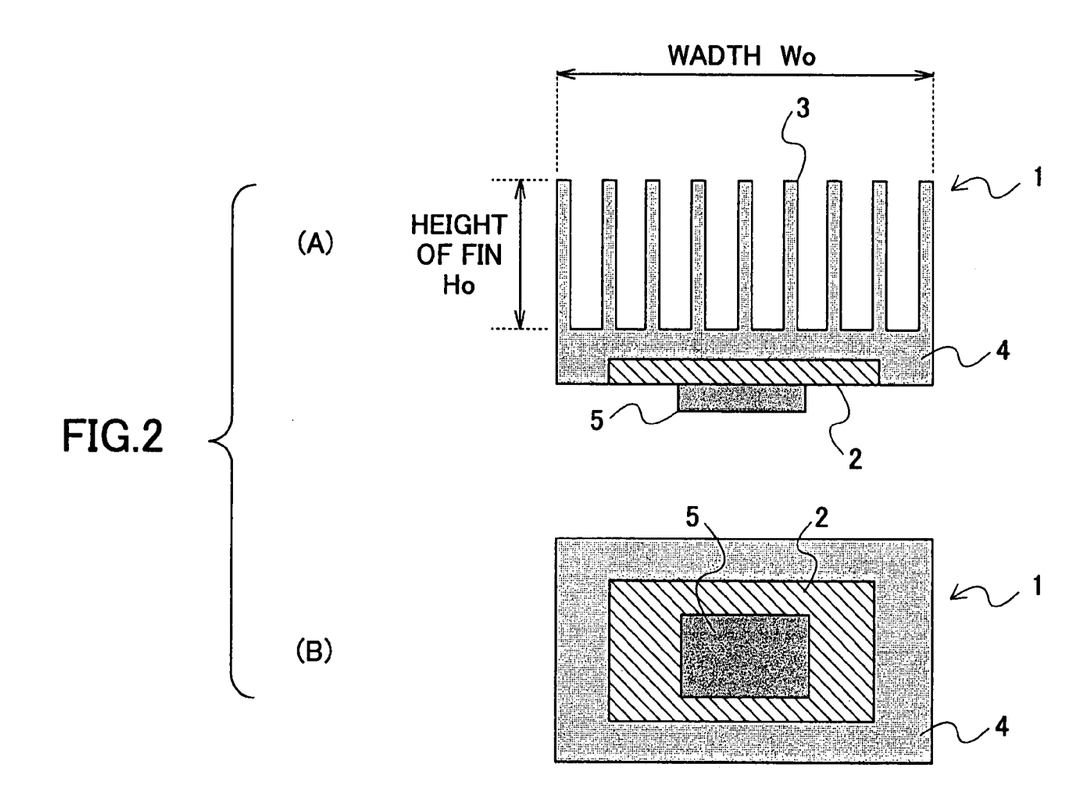
FIG. 2 is a diagram for explaining the composition of a semiconductor device comprising the conventional heat sink shown in FIG. 1.

As shown in FIG. 1 and FIG. 2, the conventional heat sink 1 comprises a base 4 on which a plurality of heat-radiating fins 3 are arranged in parallel formation, and a heat spreader 2 which is bonded to the front surface of the semiconductor device 5.

The semiconductor device 5 is, for example, a heat-producing semiconductor component, such as LSI. The base 4 may be formed of a metallic material, such as aluminum. The heat spreader 2 may be formed of a metallic material, such as copper, which has a heat conductivity higher than that of the metallic material of the base 4.

In the conventional heat sink, by carrying out a predetermined forming process, the heat spreader 2 made of copper is embedded in the back surface of the base 4 made of aluminum, so that the metallic materials are bonded to each other by the metal junction.

As shown in FIG. 2, in the case of the conventional heat sink 1, all the front surface of the heat spreader 2 is brought in contact with the base 4. The front surface of the semiconductor device 5 is bonded to the heat spreader 2 by using the adhesion agent or mechanical junction. Although the semiconductor device 5 generates heat at the time of operation, the heat-radiating fins 3 are provided to receive the heat from the semiconductor device 5 through the heat spreader 2 and the base 4, and the received heat is dissipated in the heat-radiating fins 3.

However, there is the limitation in making small the contact thermal resistance in the interface between the semiconductor device 5 and the heat spreader 2, and the contact thermal resistance in the interface between the heat spreader 2 and the base 4, and in the case of the conventional heat sink, it is difficult to increase the cooling capacity more than a certain level.

Furthermore, in order to efficiently cool the heat-producing semiconductor device, such as LSI, it is necessary to enlarge the thickness of the base and the size (especially height) of the heat sink to some extent. However, the permissible size of the heat sink is restricted according to the composition required for the semiconductor device. Therefore, in the case of the conventional heat sink, it is difficult to increase the cooling capacity for a highly heat-producing semiconductor device while maintaining the size of the heat sink at a level equivalent to the current size.

SUMMARY OF THE INVENTION

An object of the present invention is to provide a heat sink with increased cooling capacity in which the above-described problems are eliminated.

Another object of the present invention is to provide a semiconductor device comprising a heat sink which is provided to increase the cooling capacity for the highly heat-producing semiconductor device and to allow the light-weight, slim structure of the semiconductor device.

The above-mentioned object of the invention is achieved by a heat sink for a semiconductor device, the heat sink comprising: a base having a first surface on which a plurality of heat-radiating fins are arranged, and a second surface which contacts the semiconductor device directly; and a heat spreader provided on the second surface of the base so that the heat spreader does not contact the semiconductor device directly.

Moreover, the heat sink of the present invention may be provided so that the heat spreader comprises an opening which covers at least a periphery of the semiconductor device bonded directly to the second surface of the base.

Moreover, the heat sink of the present invention may be provided so that the heat spreader comprises a plurality of heat spreader pieces arranged on the second surface of the base to encircle a periphery of the semiconductor device, the heat spreader pieces being embedded in the base so that the heat spreader pieces are flush with a back surface of the base.

Moreover, the heat sink of the present invention may be provided so that the heat spreader comprises a pair of heat spreader pieces each of which is embedded in the base to oppose one of side surfaces of the semiconductor device, each heat spreader piece having a depth that is almost the same as a depth of the base and having tapered portions along side surfaces of the heat spreader piece.

Furthermore, the above-mentioned object of the invention is achieved by a semiconductor device comprising a heat sink, the heat sink comprising: a base having a first surface on which a plurality of heat-radiating fins are arranged, and a second surface which contacts the semiconductor device directly; and a heat spreader provided on the second surface of the base so that the heat spreader does not contact the semiconductor device directly.

According to the heat sink of the present invention, the height of the heat-radiating fins can be reduced without reducing the cooling capacity for the highly heat-producing semiconductor device, such as LSI, and the lightweight, slim structure of the semiconductor device can be realized. The heat-conduction loss in the contact region between the heat spreader and the base can be reduced when compared with the conventional heat sink, and the heat can be efficiently dissipated in the whole heat-radiating fins of the heat sink. Therefore, the heat sink of the present invention can provide an increased cooling capacity for the highly heat-producing semiconductor device.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of preferred embodiments of the present invention with reference to the accompanying drawings.

In the following, the elements of the heat sink according to the invention which are essentially the same as corresponding elements of the above-described conventional heat sink are designated by the same reference numerals, and a description thereof will be omitted, for the sake of convenience.

Figure 3:
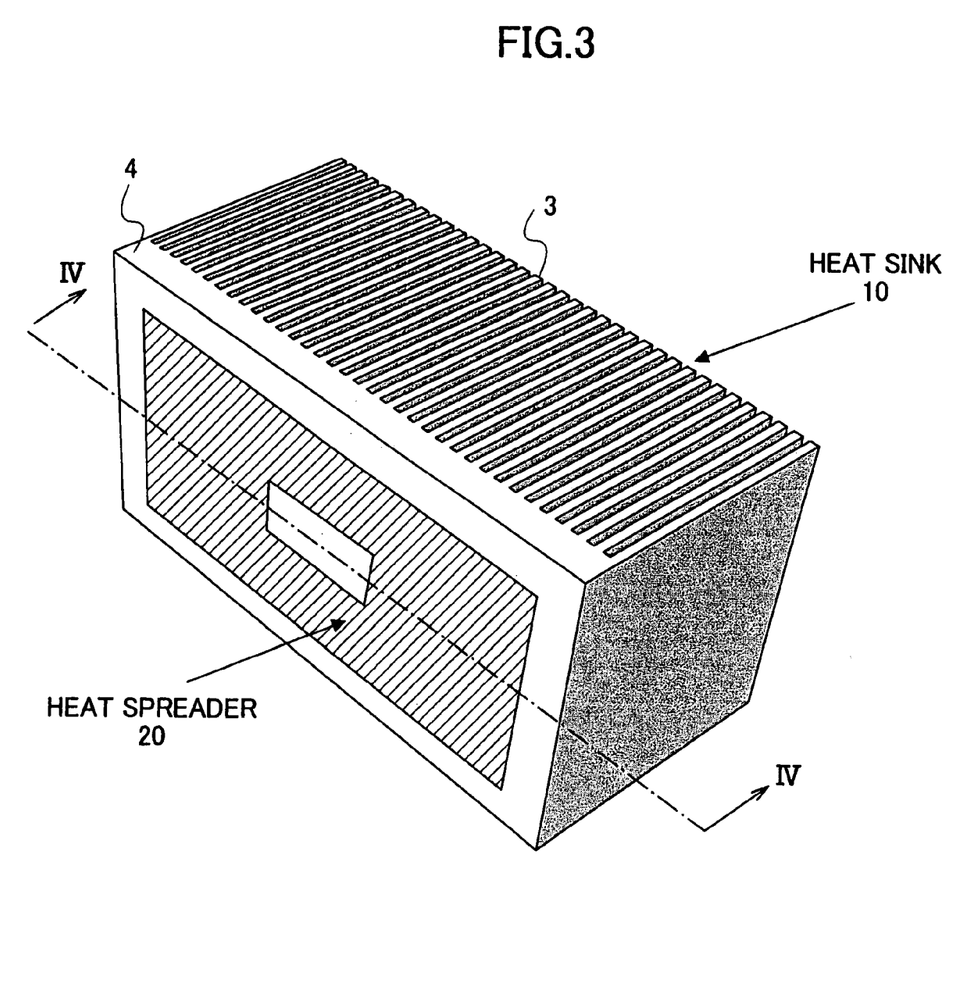
FIG. 3 is a diagram showing the composition of the heat sink of the present invention.
Figure 4:
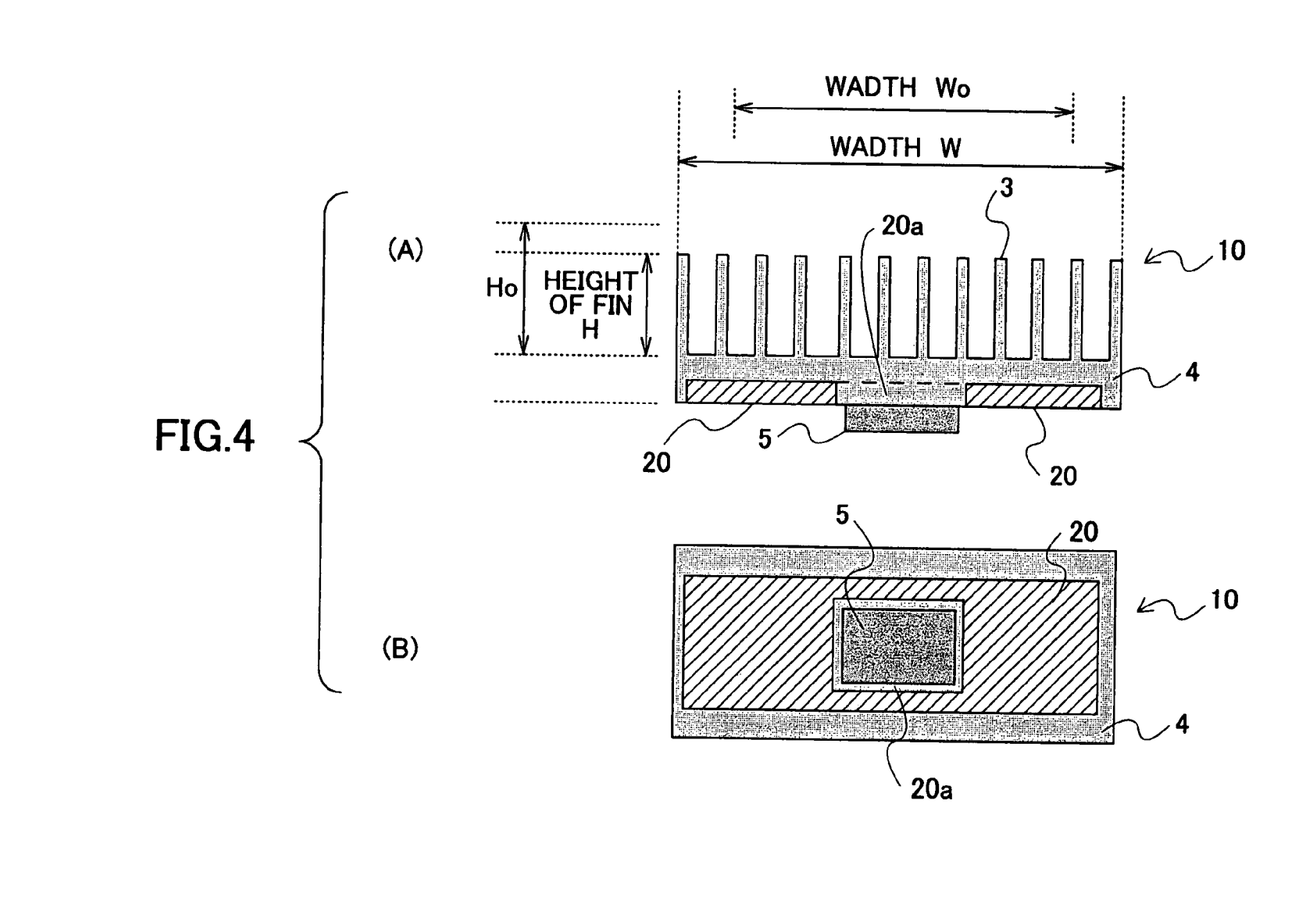
FIG. 4 is a diagram for explaining the composition of a semiconductor device comprising the heat sink shown in FIG. 3.

FIG. 3 shows the composition of the heat sink 10 of the present invention. FIG. 4 shows the composition of a semiconductor device comprising the heat sink 10 shown in FIG. 3. In FIG. 4, (A) indicates the cross-section of the semiconductor device taken along the one-dot chain line IV-IV shown in FIG. 3, and (B) indicates the back surface of the semiconductor device.

As shown in FIG. 3 and FIG. 4, the heat sink 10 of the present invention comprises the base 4 and a heat spreader 20. The base 4 has the front surface on which the plurality of heat-radiating fins 3 are arranged in parallel formation, and the back surface to which the semiconductor device 5 is bonded directly.

The heat spreader 20 is interposed between the heat-radiating fins 3 of the base 4 and the semiconductor device 5, and it is embedded in the back surface of the base 4 so that the heat spreader 20 does not contact the semiconductor device 5 directly. The semiconductor device 5 is, for example, a heat-producing semiconductor component, such as LSI.

Similar to the conventional heat sink 1, in the heat sink 10 of the present invention, the base 4 may be formed of a metallic material, such as aluminum, and the heat spreader 20 may be formed of a metallic material, such as copper, which has a heat conductivity higher than that of the metallic material of the base 4.

In the heat sink 10 shown in FIG. 4, by carrying out an extrusion-molding process, the heat spreader 20 made of copper is embedded in the back surface of the base 4 made of aluminum, so that the metallic materials are bonded to each other by the metal junction.

As shown in FIG. 4, in the heat sink 10 of the present invention, the semiconductor device 5 is bonded directly to the back surface of the base 4. By forming an opening 20a in the heat spreader 20 so that the opening 20a encircles at least the periphery of the semiconductor device 5, the heat spreader 20 does not contact the semiconductor device 5 directly. The heat spreader 20 is embedded in the back surface of the base 4 such that the periphery of the semiconductor device 5 is encircled by the opening 20a of the heat spreader 20.

Therefore, apart from the conventional heat sink 1, the contact thermal resistance in the interface between the heat spreader 20 and the central region of the back surface of the base 4 does not occur according to the heat sink 10 of the present invention. The front surface of the semiconductor device 5 is bonded directly to the central region of the back surface of the base 4.

With the heat sink 10 of the present invention, the semiconductor device 5 generates heat during operation. The heat from the semiconductor device 5 tends to transfer to the heat-radiating fins 3 arranged in the central region of the front surface of the base 4 through the base 4. Since the contact thermal resistance in the interface between the heat spreader 20 and the central region of the back surface of the base 4 does not occur, the heat from the semiconductor device 5 readily transfers also to the heat-radiating fins 3 arranged in the circumferential region of the front surface of the base 4 through the heat spreader 20 made of the metallic material with a higher temperature conductivity, and through the base 4.

In other words, the whole heat-radiating fins 3 of the front surface of the base 4 can be made to efficiently conduct the heat generated by the semiconductor device 5, and the heat-conduction loss in the interface between the heat spreader 20 and the base 4 can be reduced apart from the conventional heat sink 1. Therefore, the heat sink 10 of the present invention can provide high cooling capacity for a highly-heat-producing semiconductor device 5.

In order to explain in what extent the heat sink 10 of the present invention can increase the cooling capacity in comparison with the case of the conventional heat sink 1, the following simulation analyses are performed. A description will be given of the results of the simulation analyses.

For the sake of convenience, an LSI chip whose cross section is square and whose size is 31 mm×31 mm is used as the semiconductor device 5 in the simulation analyses. The results of the simulation analyses are obtained by computing the cooling capacity (thermal resistance) of the conventional heat sink 1 of FIG. 2 and the cooling capacity (thermal resistance) of the heat sink 10 of FIG. 4, respectively, when this semiconductor device (the LSI chip) is operated under the same thermal conditions (10 W).

As the analysis conditions common to both the conventional heat sink 1 and the heat sink 10, the array of the heat-radiating fins has the size of 90 mm×90 mm×60 mm, the ambient temperature (Ta) of the heat sink is set at 45 degrees C., the heat sink is placed horizontally, the thickness of the base 4 is 3 mm, the number of the fins is 30, and the size of the heat spreader is 66 mm×66 mm×2 mm.

Moreover, although each of the conventional heat sink 1 of FIG. 2 and the heat sink 10 of FIG. 4 has the rectangular cross-section, it is assumed that all of the semiconductor device 5, the conventional heat sink 1, and the heat sink 10 of the present invention used for the simulation analyses have the square cross-section.

Moreover, for the purpose of the simulation analyses, it is assumed that the conventional heat sink 1 is configured so that the entire surface of the copper heat spreader 2 is embedded in the back surface of the base 4, and the semiconductor device 5 (LSI) is bonded directly to the back surface of the heat spreader 2 as shown in FIG. 2.

In the case of the conventional heat sink 1, the analysis results show that the temperature (junction temperature Tc) in the bonded area of the heat sink 1 and the LSI, which is computed under the above-mentioned heating conditions, is about 83.1 degrees C., and the computed cooling capacity (thermal resistance) is about 3.8 degrees C./W.

On the other hand, in the heat sink 10 of the present invention, the semiconductor device 5 (LSI) is bonded directly to the back surface of the base 4, the opening 20a which encircles the periphery of the semiconductor device 5 is provided in the copper heat spreader 20, and the heat spreader 20 is bonded to the back surface of the base 4 without contacting the semiconductor device 5 directly as shown in FIG. 4.

In the case of the heat sink 10 of the present invention, the analysis results show that the temperature (junction temperature Tc) in the bonded area of the heat sink 1 and the LSI, which is computed under the above-mentioned heating conditions, is about 79.2 degrees C., and the computed cooling capacity (thermal resistance) is about 3.4 degrees C./W.

Namely, it is confirmed that, when compared with the conventional heat sink 1, the cooling capacity in the case of the heat sink 10 of the present invention is increased about 10%.

As described above, since an increased cooling capacity can be provided according to the heat sink 10 of the present invention, when the miniaturization and slim structure of the semiconductor device are required, the height of the fins can be made smaller than the height of the fins (Ho indicated in FIG. 2) of the conventional heat sink 1.

Namely, since the heat sink 10 of the present invention can provide an increased cooling capacity even when the length of the heat sink in the width direction is expanded to some extent, it is possible to make the height of the fins smaller than that of the conventional heat sink 1, and therefore the miniaturization and slim structure of the semiconductor device 5 can be realized.

As shown in FIG. 4, according to the heat sink 10 of the present invention, even when it is formed so that the base 4 has a width (W indicated in FIG. 4) larger than the width (Wo indicated in FIG. 2) of the conventional heat sink 1, the cooling capacity for the highly-heat-producing semiconductor devices, such as LSI, is not reduced significantly. Therefore, it is possible to constitute the heat sink 10 which has the height of the fins (H indicated in FIG. 4) smaller than the height of the fins (Ho indicated in FIG. 2) of the conventional heat sink 1. Hence, the miniaturization and slim structure of the semiconductor device 5 can be realized.

Figure 5:
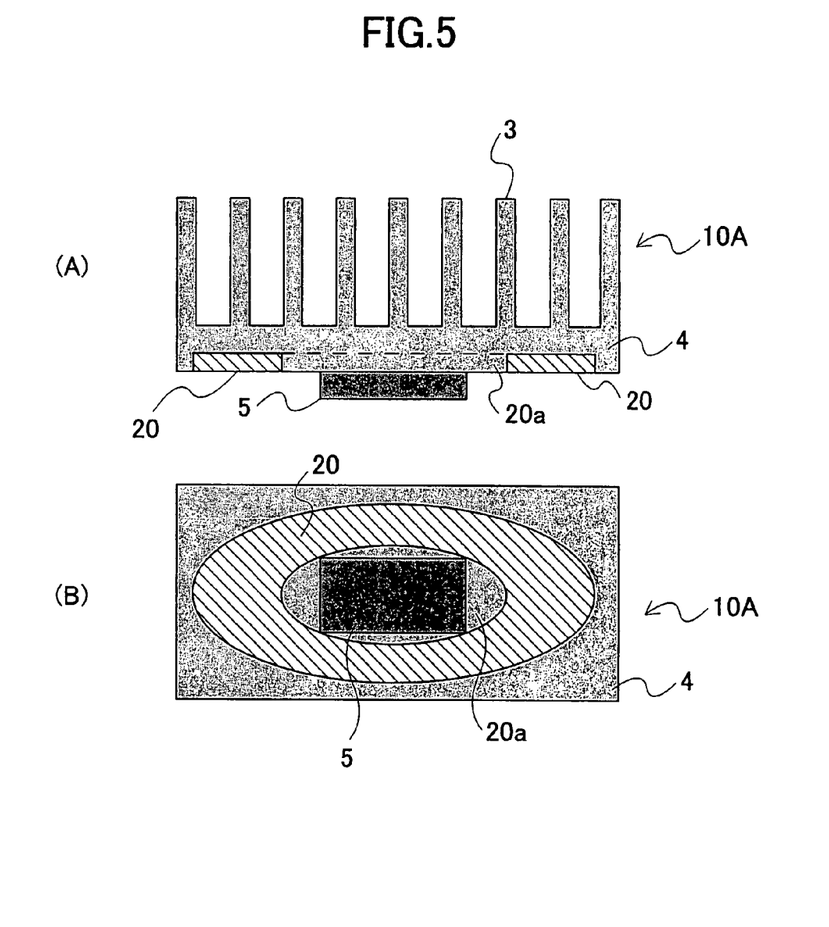
FIG. 5 is a diagram for explaining the composition of a semiconductor device comprising a heat sink in a preferred embodiment of the invention.

Next, FIG. 5 shows the composition of a semiconductor device comprising a heat sink in a preferred embodiment of the invention.

Similar to FIG. 4, the heat sink 10A of this embodiment comprises the base 4 and the heat spreader 20. The base 4 has the front surface on which the plurality of heat-radiating fins 3 are arranged in parallel formation, and has the back surface to which the semiconductor device 5 is bonded directly.

The heat spreader 20 is interposed between the heat-radiating fins 3 of the base 4 and the semiconductor device 5, and it is embedded in the back surface of the base 4 so that the heat spreader 20 does not contact the semiconductor device 5 directly.

As shown in FIG. 5, the heat spreader 20 of this embodiment is provided in elliptical formation, and the heat spreader 20 has a sufficiently large width (which is the length in the direction of the major axis) so as to cover the whole heat-radiating fins 3 of the base 4.

Moreover, the heat spreader 20 of this embodiment is provided to have an elliptical opening 20a which encircles the periphery of the semiconductor device 5. The heat spreader 20 is embedded in the back surface of the base 4 so that the bottom of the heat spreader 20 is flush with the back surface of the base 4.

In the case of the heat sink 10A of this embodiment, when forming the groove of the base 4 in which the heat spreader 20 is embedded, the extrusion process or the die-casting process is performed. When it is formed through the extrusion process, it is necessary to additionally perform cutting or machining as a post-processing.

According to the heat sink 10A of this embodiment, the height of the heat-radiating fins can be reduced without reducing the cooling capacity for a highly heat-producing semiconductor device, such as LSI, and the lightweight, slim structure of the semiconductor device can be realized.

Moreover, the heat can be efficiently dissipated in the whole heat-radiating fins of the heat sink 10A with the heat spreader 20 of this embodiment, and a high cooling capacity can be provided for the highly heat-producing semiconductor device.

Figure 6:
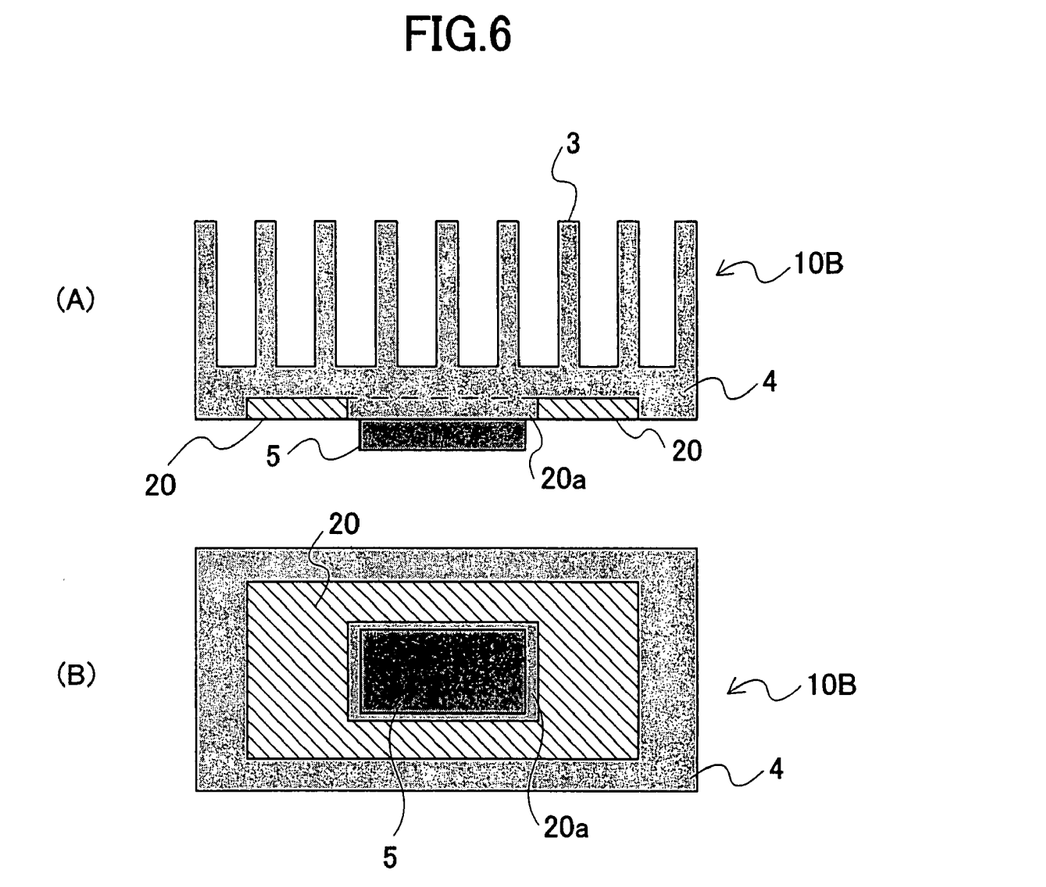
FIG. 6 is a diagram for explaining the composition of a semiconductor device comprising a heat sink in another preferred embodiment of the invention.

FIG. 6 shows the composition of a semiconductor device comprising a heat sink in another preferred embodiment of the invention.

Similar to FIG. 4, the heat sink 10B of this embodiment comprises the base 4 and the heat spreader 20. The base 4 has the front surface on which the plurality of heat-radiating fins 3 are arranged in parallel formation, and has the back surface to which the semiconductor device 5 is bonded directly.

The heat spreader 20 is interposed between the heat-radiating fins 3 of the base 4 and the semiconductor device 5, and it is embedded in the back surface of the base 4 so that the heat spreader 20 does not contact the semiconductor device 5 directly.

As shown in FIG. 6, the heat spreader 20 of this embodiment is provided in rectangular formation, and the heat spreader 20 has a sufficiently large width so as to cover the whole heat-radiating fins 3 of the base 4.

Moreover, the heat spreader 20 of this embodiment is provided to have an opening 20a in the shape of a rectangle which encircles the periphery of the semiconductor device 5. The heat spreader 20 is embedded in the back surface of the base 4 so that the bottom of the heat spreader 20 is flush with the back surface of the base 4.

In the case of the heat sink 10B of this embodiment, when forming the groove of the base 4 in which the heat spreader 20 is embedded, the extrusion process or the die-casting process is performed. When it is formed through the extrusion process, it is necessary to additionally perform cutting or machining as a post-processing.

According to the heat sink 10B of this embodiment, the height of the heat-radiating fins can be reduced without reducing the cooling capacity for a highly heat-producing semiconductor device, such as LSI, and the lightweight, slim structure of the semiconductor device can be realized.

Moreover, the heat can be efficiently dissipated in the whole heat-radiating fins of the heat sink with the heat spreader 20 of this embodiment, and a high cooling capacity can be provided for the highly heat-producing semiconductor device.

Figure 7:
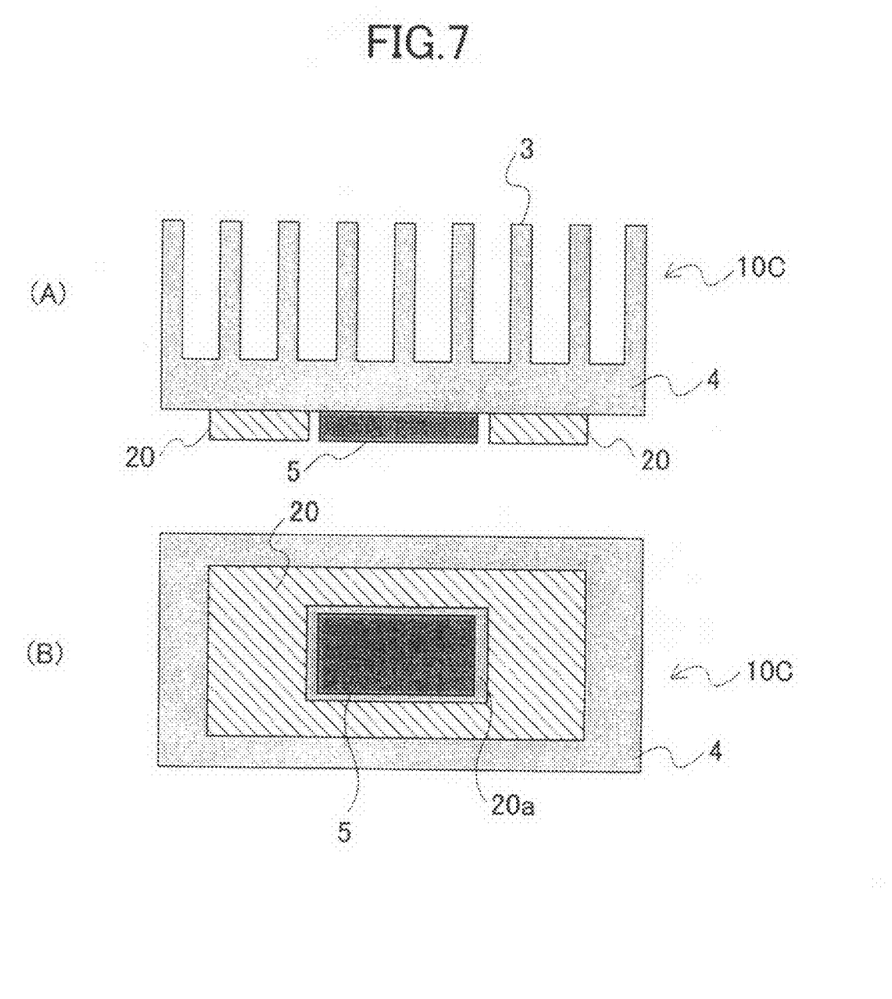
FIG. 7 is a diagram for explaining the composition of a semiconductor device comprising a heat sink in another preferred embodiment of the invention.

FIG. 7 shows the composition of a semiconductor device comprising the heat sink in another preferred embodiment of the invention.

Similar to FIG. 4, the heat sink 10C of this embodiment comprises the base 4 and the heat spreader 20. The base 4 has the front surface on which the plurality of heat-radiating fins 3 are arranged in parallel formation, and has the back surface to which the semiconductor device 5 is bonded directly.

The heat spreader 20 is interposed between the heat-radiating fins 3 of the base 4 and the semiconductor device 5, and it is bonded to the back surface of the base 4 so that the heat spreader 20 does not contact the semiconductor device 5 directly.

As shown in FIG. 7, the heat sink 10C of this embodiment is the attachment type heat sink. The opening 20a which encircles the periphery of the semiconductor device 5 is provided in the central region of the heat spreader 20, and the heat spreader 20 is bonded in the state where it is attached to the back surface of the base 4.

The heat spreader 20 is provided with the opening 20a and it does not contact the semiconductor device 5 directly. The heat spreader 20 has a sufficiently large width so as to cover the whole heat-radiating fins 3 of the base 4 and it is interposed between the heat-radiating fins 3 of the base 4 and the semiconductor device 5. Therefore, the heat generated by the semiconductor device 5 can be efficiently dissipated in the whole heat-radiating fins 3 of the base 4.

According to the heat sink 10C of this embodiment, the height of the heat-radiating fins can be reduced without reducing the cooling capacity for a highly heat-producing semiconductor device, such as LSI, and the lightweight, slim structure of the semiconductor device can be realized.

Moreover, the heat can be efficiently dissipated in the whole heat-radiating fins of the heat sink with the heat spreader 20 of this embodiment, and a high cooling capacity can be provided for the highly heat-producing semiconductor device.

Figure 8:
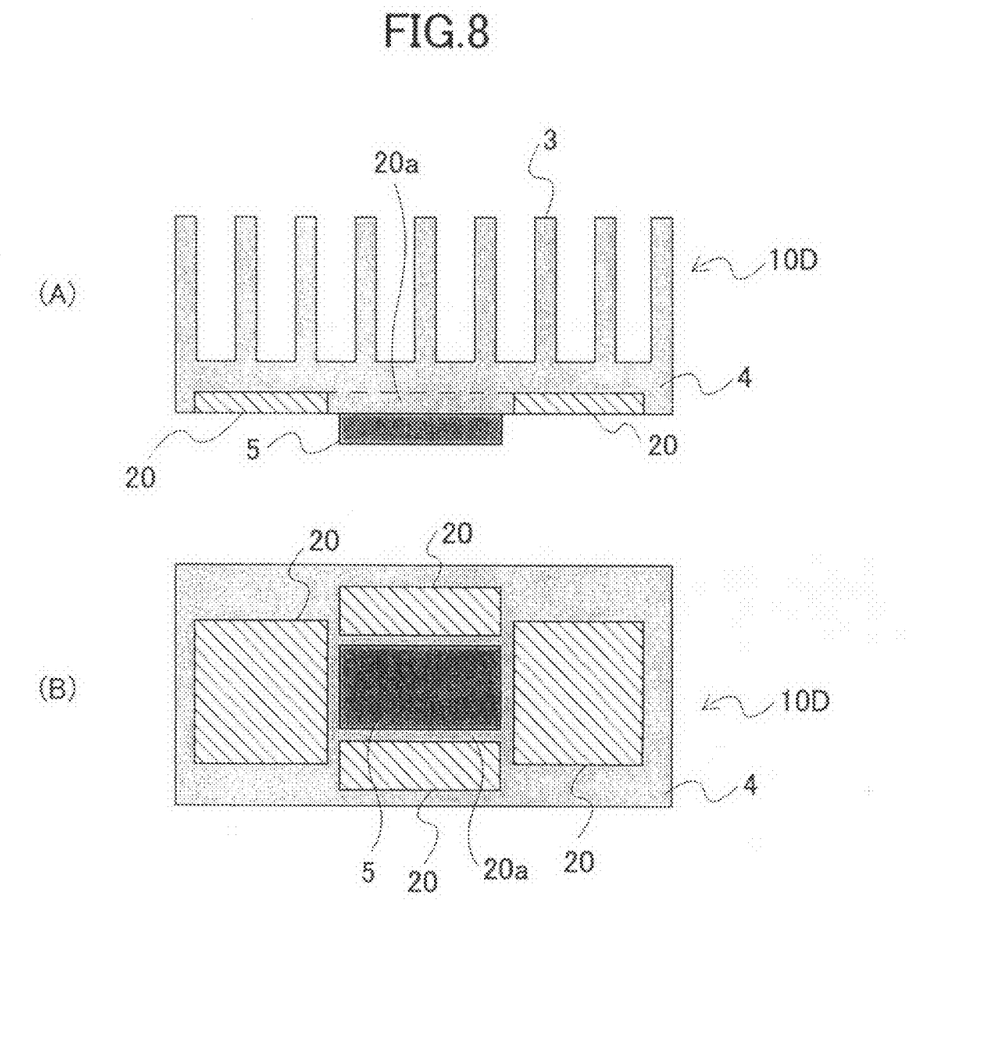
FIG. 8 is a diagram for explaining the composition of a semiconductor device comprising a heat sink in another preferred embodiment of the invention.

FIG. 8 shows the composition of a semiconductor device comprising a heat sink in another preferred embodiment of the invention.

Similar to FIG. 4, the heat sink 10D of this embodiment comprises the base 4 and the heat spreader 20. The base 4 has the front surface on which the plurality of heat-radiating fins 3 are arranged in parallel formation, and has the back surface to which the semiconductor device 5 is bonded directly.

The heat spreader 20 is interposed between the heat-radiating fins 3 of the base 4 and the semiconductor device 5, and it is embedded in the back surface of the base 4 so that the heat spreader 20 does not contact the semiconductor device 5 directly.

As shown in FIG. 8, the heat spreader 20 of this embodiment comprises the four heat spreader pieces which are arranged on the back surface of the base 4 to encircle the periphery of the semiconductor device 5, and they are embedded in the base 4 so that the bottom of these heat spreader pieces 20 is flush with the back surface of the base 4. The portion of the back surface of the base 4 surrounded by the four heat spreader pieces 20 serves as the opening 20a.

In the case of the heat sink 10D of this embodiment, when forming the groove of the base 4 in which the heat spreader is embedded, the extrusion process or the die-casting process is performed. When it is formed through the extrusion process, it is necessary to additionally perform cutting or machining as a post-processing.

According to the heat sink 10D of this embodiment, the height of the heat-radiating fins can be reduced without reducing the cooling capacity for a highly heat-producing semiconductor device, such as LSI, and the lightweight, slim structure of the semiconductor device can be realized.

Moreover, the heat can be efficiently dissipated in the whole heat-radiating fins of the heat sink with the heat spreader 20 of this embodiment, and a high cooling capacity can be provided for the highly heat-producing semiconductor device.

Figure 9:
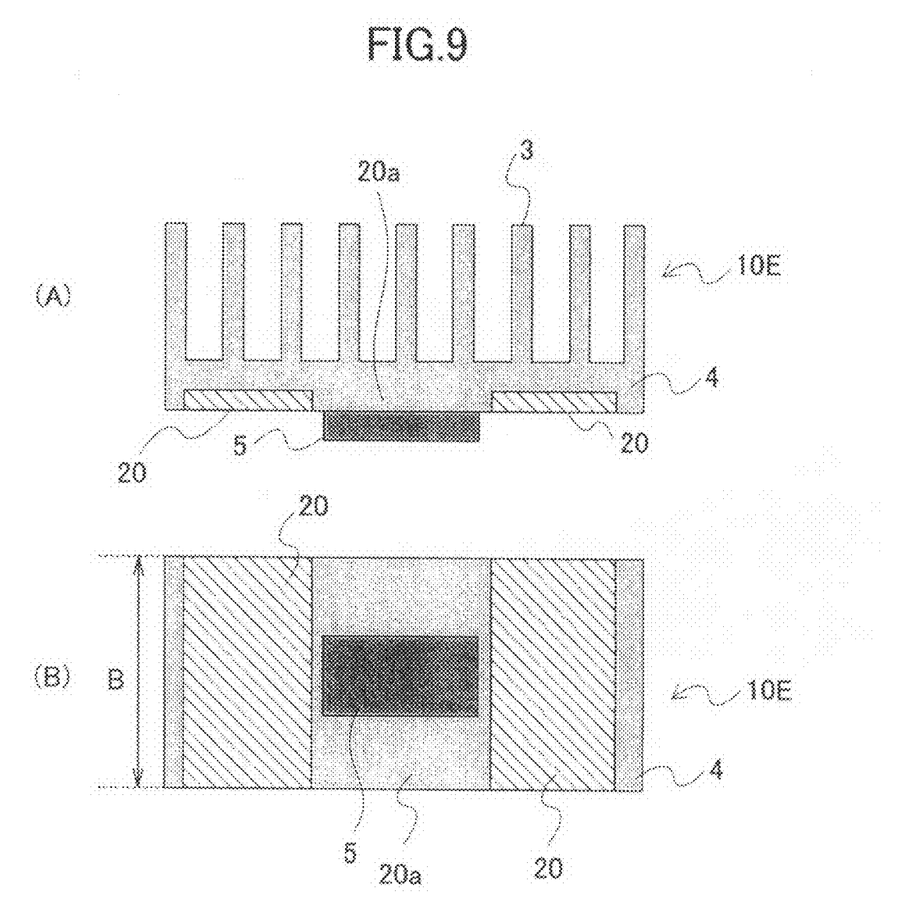
FIG. 9 is a diagram for explaining the composition of a semiconductor device comprising a heat sink in another preferred embodiment of the invention.

FIG. 9 shows the composition of a semiconductor device comprising a heat sink in another preferred embodiment of the invention.

Similar to FIG. 4, the heat sink 10E of this embodiment comprises the base 4 and the heat spreader 20. The base 4 has the front surface on which the plurality of heat-radiating fins 3 are arranged in parallel formation, and has the back surface to which the semiconductor device 5 is bonded directly.

The heat spreader 20 is interposed between the heat-radiating fins 3 of the base 4 and the semiconductor device 5, and it is embedded in the back surface of the base 4 so that the heat spreader 20 does not contact the semiconductor device 5 directly.

As shown in FIG. 9, the heat spreader 20 of this embodiment comprises a pair of heat spreader pieces each of which is embedded in the base 4 to oppose one of the side surfaces of the semiconductor device 5, and each heat spreader piece 20 having a depth that is almost the same as a depth (B indicated in FIG. 9(B)) of the base 4. The portion of the back surface of the base 4 surrounded by the heat spreader pieces 20 of this embodiment serves as the opening 20a.

In the case of the heat sink 10E of this embodiment, when forming the groove of the base 4 in which the heat spreader 20 is embedded, it is possible to perform only the extrusion process. It is not necessary to additionally perform cutting or machining as a post-processing which is needed for the previously described embodiments.

On the other hand, in the case of the conventional heat sink using the embedded type heat spreader, after the heat spreader is embedded in the base of the conventional heat sink, it is necessary to additionally perform the post-processing (for example, cutting, machining or the like) on the base in order to obtain a sufficient level of parallelism.

However, according to the heat sink 10E of this embodiment, performing such post-processing is unnecessary, and therefore the heat sink 10E of this embodiment is useful for reduction of the manufacturing cost.

Figure 10:
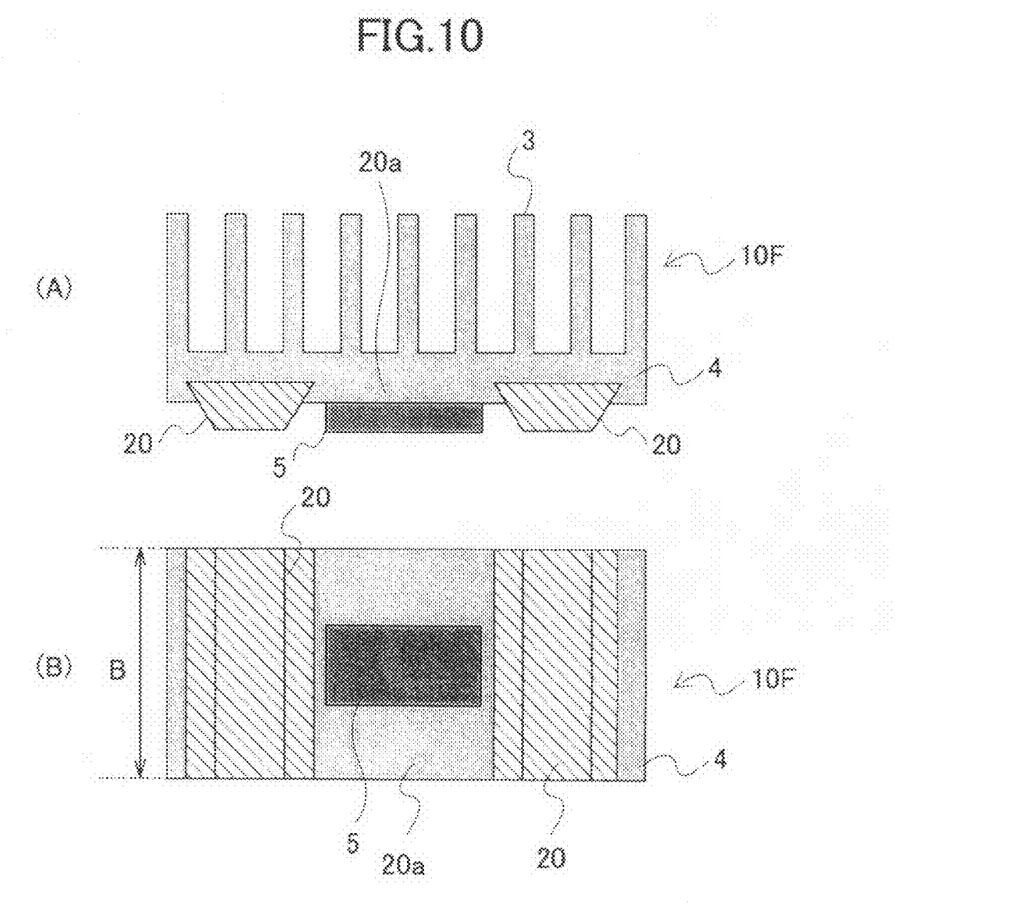
FIG. 10 is a diagram for explaining the composition of a semiconductor device comprising a heat sink in another preferred embodiment of the invention.

FIG. 10 shows the composition of a semiconductor device comprising a heat sink in another preferred embodiment of the invention.

Similar to FIG. 4, the heat sink 10F of this embodiment comprises the base 4 and the heat spreader 20. The base 4 has the front surface on which the plurality of heat-radiating fins 3 are arranged in parallel formation, and has the back surface to which the semiconductor device 5 is bonded directly.

The heat spreader 20 is interposed between the heat-radiating fins 3 of the base 4 and the semiconductor device 5, and it is embedded in the back surface of the base 4 so that the heat spreader 20 does not contact the semiconductor device 5 directly.

As shown in FIG. 10, the heat spreader 20 of this embodiment comprises a pair of heat spreader pieces each of which is embedded in the base 4 to oppose one of the side surfaces of the semiconductor device 5, each heat spreader piece 20 having a depth that is almost the same as a depth (B indicated in FIG. 10(B)) of the base 4, and each heat spreader piece 20 having tapered portions along the side surfaces of the heat spreader piece 20.

The portion of the back surface of the base 4 surrounded by the heat spreader pieces 20 of this embodiment serves as the opening 20a. Each heat spreader piece 20 having the tapered portions is provided so that the heat spreader piece has a varying width that gradually decreases in the downward direction. Namely, because of the tapered portions, the width of each heat spreader piece 20 at the top thereof is the maximum width, and the width of each heat spreader piece 20 at the bottom thereof is the minimum width as shown in FIG. 10(A).

Moreover, in the case of the heat sink 10F of this embodiment, when forming the groove of the base 4 in which the heat spreader 20 is embedded, it is possible to perform only the extrusion process. It is not necessary to additionally perform cutting or machining as a post-processing which is needed for the previously described embodiments.

Furthermore, in the case of the heat sink 10F of this embodiment, the tapered portions, which make the width of the heat spreader gradually decrease in the downward direction, are formed on the side surfaces of each heat spreader piece 20, and it is possible to prevent separation of the heat spreader pieces 20 from the base 4 even when a special bonding process is not performed after the heat spreader pieces 20 are fitted in the grooves of the base 4. Therefore, performing the post-processing and performing the special bonding process are unnecessary, and the heat sink 10F of this embodiment is more useful for reduction of the manufacturing cost.

The present invention is not limited to the above-described embodiments, and variations and modifications may be made without departing from the scope of the present invention.

What is claimed is:

1. A heat sink for a semiconductor device, comprising:
   a base formed of a metallic material having a first surface on which a plurality of heat-radiating fins are arranged, and a second surface arranged to contact a semiconductor device directly;
   a heat spreader formed of a metallic material which has a heat conductivity higher than that of the metallic material of the base provided on the second surface of the base arranged such that the heat spreader does not contact a semiconductor device directly when a semiconductor device is in contact with the second surface; and
   a semiconductor device bonded directly to the second surface of the base.

* * * * *